(12) United States Patent
Bour et al.

(10) Patent No.: US 7,399,653 B2
(45) Date of Patent: Jul. 15, 2008

(54) NITRIDE OPTOELECTRONIC DEVICES WITH BACKSIDE DEPOSITION

(75) Inventors: David Bour, Cupertino, CA (US); Jacob Smith, Santa Clara, CA (US); Jie Su, Santa Clara, CA (US); Sandeep Nijhawan, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 263 days.

(21) Appl. No.: 11/414,581

(22) Filed: Apr. 28, 2006

(65) Prior Publication Data

US 2007/0254390 A1 Nov. 1, 2007

(51) Int. Cl.
*H01L 21/00* (2006.01)
(52) U.S. Cl. .................. 438/46; 438/478; 438/479
(58) Field of Classification Search .................. 438/46, 438/478, 479, 483
See application file for complete search history.

*Primary Examiner*—Michael S. Lebentritt
*Assistant Examiner*—Kenisha V Ford
(74) *Attorney, Agent, or Firm*—Townsend and Townsend and Crew

(57) ABSTRACT

Nitride optoelectronic devices that have asymmetric double-sided structures and methods fabricating such structures are disclosed. Two n-type III-N layers are formed simultaneously over opposite sides of a substrate with substantially the same composition. Thereafter, a p-type III-N active layer is formed over one of the n-type III-N layers but not over the other.

14 Claims, 5 Drawing Sheets

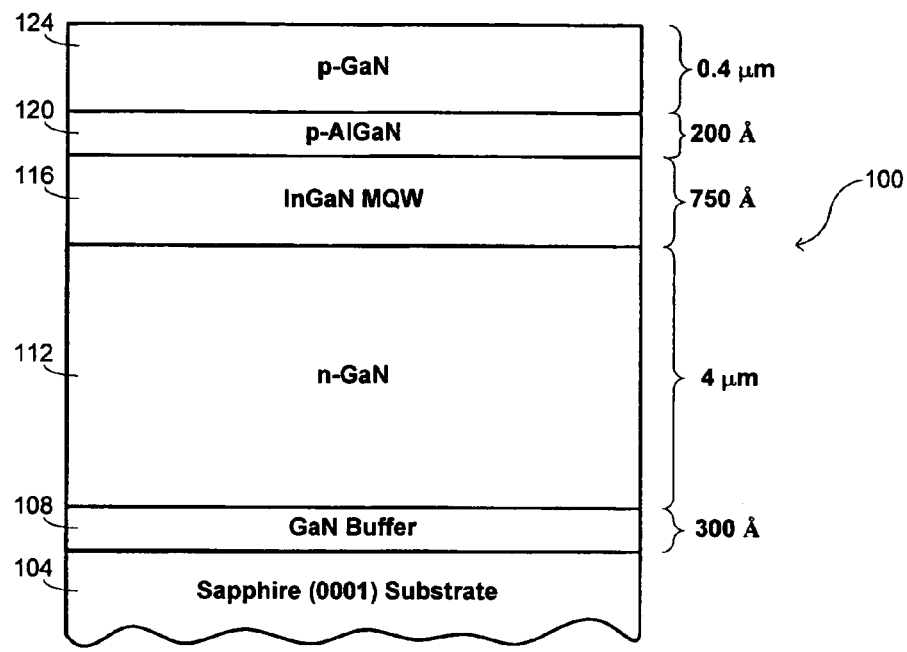
Fig. 1
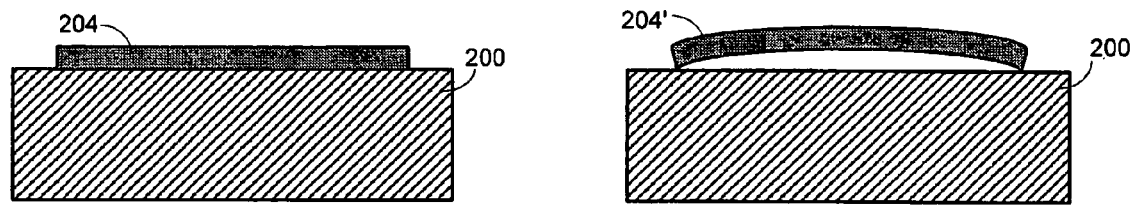
Fig. 2A  Fig. 2B

NITRIDE OPTOELECTRONIC DEVICES WITH BACKSIDE DEPOSITION

CROSS-REFERENCES TO RELATED APPLICATIONS

This application is related to the following copending, commonly assigned applications, the entire disclosure of each of which is incorporated herein by reference for all purposes: U.S. patent application Ser. No. 11/404,525, entitled "STACKED-SUBSTRATE PROCESSES FOR PRODUCTION OF NITRIDE SEMICONDUCTOR STRUCTURES," by David Bour et al. U.S. patent application Ser. No. 11/404,390, entitled "DUAL-SIDE EPITAXY PROCESSES FOR PRODUCTION OF NITRIDE SEMICONDUCTOR STRUCTURES," by Sandeep Nijhawan and U.S. patent application Ser. No. 11/404,642, entitled "DOUBLE-SIDED NITRIDE STRUCTURES," by Sandeep Nijhawan et al.

BACKGROUND OF THE INVENTION

The history of light-emitting diodes ("LEDs") is sometimes characterized as a "crawl up the spectrum." This is because the first commercial LEDs produced light in the infrared portion of the spectrum, followed by the development of red LEDs that used GaAsP on a GaAs substrate. This was, in turn, followed by the use of GaP LEDs with improved efficiency that permitted the production of both brighter red LEDs and orange LEDs. Refinements in the use of GaP then permitted the development of green LEDs, with dual GaP chips (one in red and one in green) permitting the generation of yellow light. Further improvements in efficiency in this portion of the spectrum were later enabled through the use of GaAlAsP and InGaAlP materials.

This evolution towards the production of LEDs that provide light at progressively shorter wavelengths has generally been desirable not only for its ability to provide broad spectral coverage but because diode production of short-wavelength light may improve the information storage capacity of optical devices like CD-ROMs. The production of LEDs in the blue, violet, and ultraviolet portions of the spectrum was largely enabled by the development of nitride-based LEDs, particularly through the use of GaN. While some modestly successful efforts had previously been made in the production of blue LEDs using SiC materials, such devices suffered from poor luminescence as a consequence of the fact that their electronic structure has an indirect bandgap.

While the feasibility of using GaN to create photoluminescence in the blue region of the spectrum has been known for decades, there were numerous barriers that impeded their practical fabrication. These included the lack of a suitable substrate on which to grow the GaN structures, generally high thermal requirements for growing GaN that resulted in various thermal-convection problems, and a variety of difficulties in efficient p-doping such materials. The use of sapphire as a substrate was not completely satisfactory because it provides approximately a 15% lattice mismatch with the GaN. Progress has subsequently been made in addressing many aspects of these barriers. For example, the use of a buffer layer of AlN or GaN formed from a metalorganic vapor has been helpful in accommodating the lattice mismatch. Further refinements in the production of Ga-N-based structures has included the use of AlGaN materials to form heterojunctions with GaN and particularly the use of InGaN, which causes the creation of defects that act as quantum wells to emit light efficiently at short wavelengths. Indium-rich regions have a smaller bandgap than surrounding material, and may be distributed throughout the material to provide efficient emission centers.

While some improvements have thus been made in the manufacture of such compound nitride semiconductor devices, it is widely recognized that a number of deficiencies yet exist in current manufacturing processes. Moreover, the high utility of devices that generate light at such wavelengths has caused the production of such devices to be an area of intense interest and activity. In view of these considerations, there is a general need in the art for improved methods and systems for fabricating compound nitride semiconductor devices.

BRIEF SUMMARY OF THE INVENTION

Embodiments of the invention provide nitride optoelectronic devices that have asymmetric double-sided structures and methods for fabricating such devices. In a first set of embodiments, methods are provided of fabricating a nitride optoelectronic device. A first n-type III-N layer and second n-type III-N layer are formed simultaneously over a substrate. The first n-type III-N layer is formed over a first side of the substrate and the second n-type III-N layer is formed over a second side of the substrate opposite the first side. The first and second n-type III-N layers have substantially the same composition and comprise a first group-III element and nitrogen. Thereafter, a p-type III-N active layer is formed over the first n-type III-N layer but not over the second n-type III-N layer. The p-type III-N active layer comprises a second group-III element and nitrogen. The second group-III element is different from the first group-III element.

In some instances, chemical-vapor-deposition processes may be used. For example, to form the first and second n-type III-N layers, the substrate may be disposed within a first processing chamber. A first group-III precursor and a first nitrogen precursor are flowed into the first processing chamber over the first and second sides of the substrate. The first group-III precursor comprises the first group-III element. The first and second n-type III-N layers are then deposited with a first thermal chemical-vapor-deposition process at a first elevated temperature within the first processing chamber using the first group-III precursor and the first nitrogen precursor.

The p-type III-N active layer be formed in a similar manner. The substrate is transferred from the first processing chamber to a second processing chamber different from the first processing chamber. A second group-III precursor and a second nitrogen precursor are flowed into the first processing chamber over the first side of the substrate. The second group-III element comprises the second group-III element. The p-type III-N active layer is then deposited over the first n-type III-N layer with a second thermal chemical-vapor-deposition process at a second elevated temperature within the second processing chamber using the second group-III precursor and the second nitrogen precursor.

The scope of the invention may accommodate considerable scope in composition of the layers. For instance, in one embodiment the first group-III element is gallium and the second group-III element is aluminum, with the first and second n-type III-N layers each comprising a GaN layer and the p-type III-N active layer comprising an AlGaN layer. In another embodiment, the first group-III element is gallium and the second group-III element is indium, with the first and second n-type III-N layers each comprising a GaN layer and the p-type III-N active layer comprising an InGaN layer. In a further embodiment, the first group-III element is gallium and the second group-III element includes aluminum and indium, permitting a configuration in which the first and second n-type III-N layers each comprise a GaN layer and the p-type III-N active layer comprises an AlInGaN layer.

Additional processing may be performed on the second n-type III-N layer. For instance, the second n-type III-N layer may be textured, such as by disposing the substrate within a processing chamber and flowing a corrosive stream over the second n-type III-N layer; one example of the corrosive stream comprises HCl. In another example, a lens having optical power is formed within the second n-type III-N layer.

In a second set of embodiments, a nitride optoelectronic device is provided. The device comprises a substrate, a first n-type III-N layer, a p-type III-N layer, and a second n-type III-N layer. The first n-type III-N layer overlies the first side of the substrate and comprises a first group-III element and nitrogen. The p-type III-N layer overlies the first n-type III-N layer and comprises a second group-III element and nitrogen. The second group-III element is different from the first group-III element. A second n-type III-N layer overlies the second side of the substrate opposite the first side of the substrate and has substantially the same composition as the first n-type III-N layer.

In different embodiments, the second n-type III-N layer may be textured or may comprise a lens having optical power. The substrate may be selected from the group consisting of a sapphire substrate, a SiC substrate, a silicon substrate, a spinel substrate, a lithium gallate substrate, and a ZnO substrate. The substrate may have a thickness less than 150 µm, less than 100 µm, less than 50 µm, less than 25 µm, or less than 10 µm in various specific embodiments.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

FIG. 1 provides a schematic illustration of a structure of a GaN-based LED;

FIGS. 2A and 2B illustrate how physical differences between a substrate and material deposited on the substrate may result in shape distortions of nitride-based structures;

DETAILED DESCRIPTION OF THE INVENTION

1. Overview

Figure 3A:
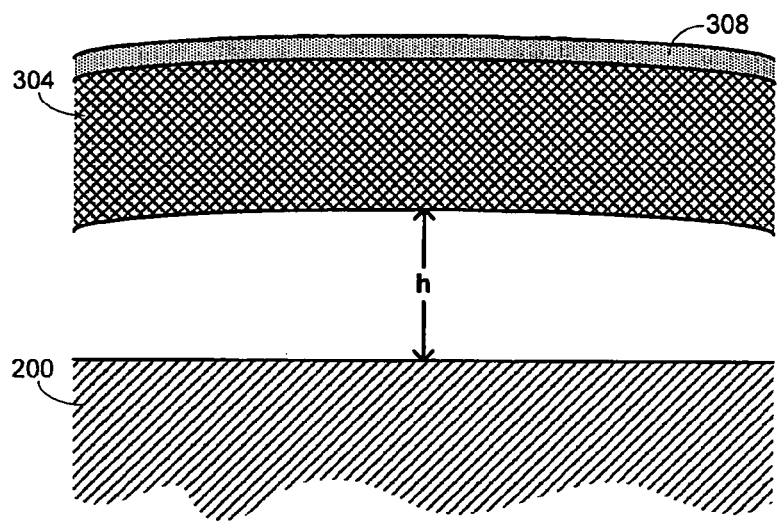
FIGS. 3A and 3B provide a quantification of the shape distortions illustrated in FIG. 2B for different nitride-based structures.

One of the difficulties mentioned-above in fabricating nitride-based structures such as GaN structures is the accommodation of generally high thermal requirements for growth of GaN. Historically, this made the identification of a suitable substrate difficult, with the art more recently focusing on ways in which the use of sapphire $Al_2O_3$ may be accommodated. Sapphire is not an ideal substrate because there is a significant lattice mismatch with deposited nitride layers; in the specific case of GaN, this lattice mismatch is approximately 15%. While the use of a nitride buffer layer has been helpful in accommodating the lattice mismatch, both the lattice mismatch and other physical differences between the sapphire substrate and overlying nitride layer result in distortions of resulting structures.

One typical nitride-based structure is illustrated in FIG. 1 as a GaN-based LED structure 100. It is fabricated over a sapphire (0001) substrate 104. An n-type GaN layer 112 is deposited over a GaN buffer layer 108 formed over the substrate. An active region of the device is embodied in a multi-quantum-well layer 116, shown in the drawing to comprise an InGaN layer. A pn junction is formed with an overlying p-type AlGaN layer 120, with a p-type GaN layer 124 acting as a contact layer.

A typical fabrication process for such an LED may use a metalorganic chemical-vapor-deposition ("MOCVD") process that follows cleaning of the substrate 104 in a processing chamber. The MOCVD deposition is accomplished by providing flows of suitable precursors to the processing chamber and using thermal processes to achieve deposition. For example, a GaN layer may be deposited using Ga and N precursors, perhaps with a flow of a fluent gas like $N_2$, $H_2$, and/or $NH_3$; an InGaN layer may be deposited using Ga, N, and In precursors, perhaps with a flow of a fluent gas; and an AlGaN layer may be deposited using Ga, N, and Al precursors, also perhaps with a flow of a fluent gas. In the illustrated structure 100, the GaN buffer layer 108 has a thickness of about 300 Å, and may have been deposited at a temperature of about 550° C. Subsequent deposition of the n-GaN layer 112 is typically performed at a higher temperature, such as around 1050° C. in one embodiment. The n-GaN layer 112 is relatively thick, with deposition of a thickness on the order of 4 µm requiring about 140 minutes. The InGaN multi-quantum-well layer 116 may have a thickness of about 750 Å, which may be deposited over a period of about 40 minutes at a temperature of about 750° C. The p-AlGaN layer 120 may have a thickness of about 200 Å, which may be deposited in about five minutes at a temperature of 950° C. The thickness of the contact layer 124 that completes the structure may be about 0.4 µm in one embodiment, and may be deposited at a temperature of about 1050° C. for around 25 minutes.

An illustration of the type of shape distortion that may result from such a deposition process is illustrated schematically with FIGS. 2A and 2B. As illustrated with the description of the structure shown in FIG. 1, fabrication processes of nitride structures may include a number of temperature changes and consistently take place at temperatures elevated from normal operational temperatures of the completed structures. In addition to there being a lattice mismatch between sapphire and GaN, such materials have different coefficients of thermal expansion, causing differences in thermal expansion at different processing temperatures. This effect is generally even more significant than the lattice mismatch in causing shape distortions. The effect is illustrated schematically in FIGS. 2A and 2B. In these drawings, element 200 is a substrate holder, over which the structure 204 being fabricated is disposed. The two drawings are at different points in time during a fabrication process, with FIG. 2B corresponding to a later time than FIG. 2A and at a lower temperature than FIG. 2A. Such a sequence may occur in a variety of different fabrication processes for nitride structures. In the specific case of the structure shown in FIG. 1, for example, FIG. 2A may correspond to a point in time during epitaxy of the n-GaN layer 112 when the temperature is about 1050° C. and FIG. 2B may correspond to a point in time during growth of the InGaN active region 116 when the temperature is about 750° C. Notably, FIG. 2B could also correspond to a point in time after the entire structure has been fabricated and cooled down to room temperature.

It is evident from the drawing that the structure 204' at the cooler temperature is deformed with a center that is bowed upwards when compared with the structure 204 at the higher temperature. This bowing results from the differential thermal expansion between GaN and sapphire. Deposition may occur with a flat geometry at the temperatures used for GaN growth as shown in FIG. 2A. But when the structure is subsequently cooled for deposition of the InGaN active region, the substrate center bows upwards and becomes somewhat cooler than the edges. This temperature nonuniformity over the surface of the structure results in a nonuniformity in indium distribution in the deposited InGaN, with indium-rich regions tending to form at the center of the substrate and indium-poor regions tending to form at the periphery of the substrate. In turn, this nonuniformity in indium distribution translates into wavelength and light-output variations for devices formed across the structure, limiting the scale-up of the process for producing these materials.

Figure 3B:
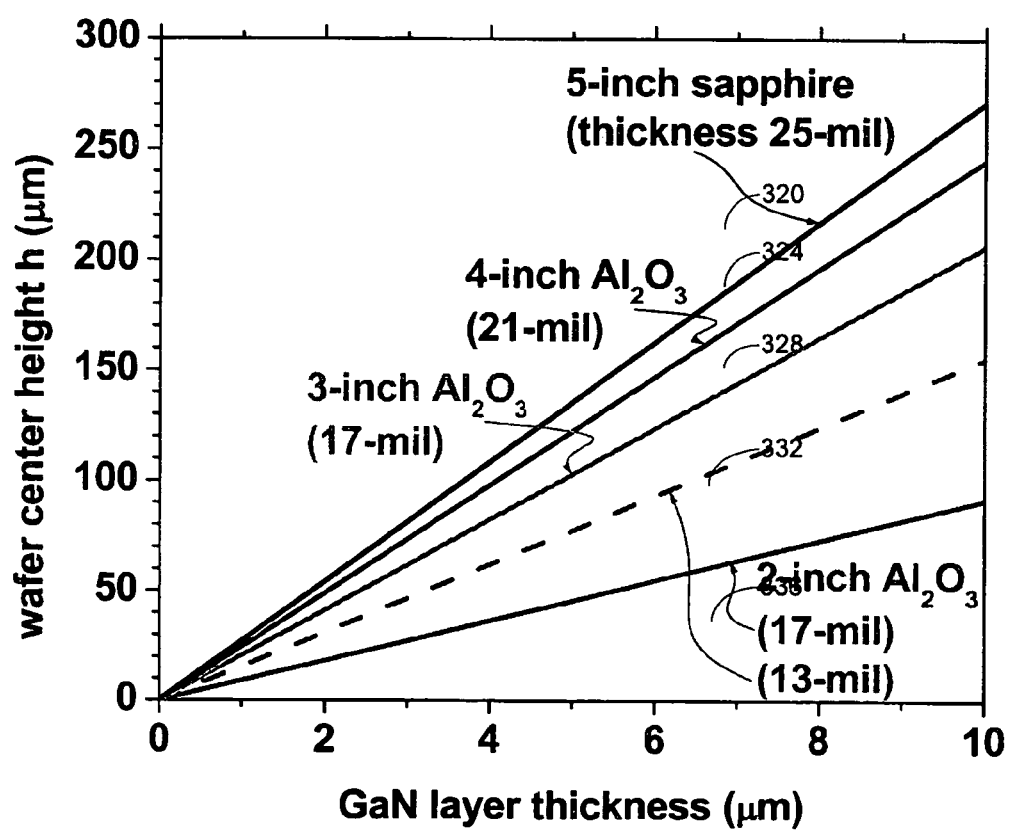

The magnitude of the bowing depends on such factors as the thickness of the substrate, the thickness of the GaN epitaxial layer, and the growth temperature. Results quantifying the effect of the relative thicknesses of the substrate and GaN epitaxial layer are presented with FIGS. 3A and 3B. FIG. 3A illustrates the arrangement that was studied and how the effect was quantified. Namely, a GaN epitaxial layer 208 was deposited over a sapphire substrate 304 at a temperature of 1050° C. The amount of bowing was quantified by the height h of the center of the substrate 304 over a substrate support holder after cooling the structure to room temperature. Results are presented in FIG. 3B for sapphire substrates having commonly used diameters and thicknesses. Line 320 shows results for deposition on a five-inch sapphire substrate having a thickness of 25 mil; line 324 shows results for deposition on a four-inch sapphire substrate having a thickness of 21 mil; line 328 shows results for deposition on a three-inch sapphire substrate having a thickness of 17 mil; line 332 shows results for deposition on a two-inch sapphire substrate having a thickness of 13 mil; and line 336 shows results for deposition on a two-inch sapphire substrate having a thickness of 17 mil. The results exhibit general trends in which the bowing is more pronounced both with a larger-diameter substrate, a thinner substrate, and with a thicker layer of deposited GaN, reflecting the fact that the differential in thermal expansion may be increased with either portion of the structure.

Embodiments of the invention mitigate this effect by depositing material on two sides of a substrate. While it is generally preferred that the deposition on the two sides take place simultaneously, this is not a requirement of the invention and deposition may sometimes take place sequentially. The bowing effect is mitigated by such processes because the tendency of the structure to bow on one side is counteracted by an opposite tendency of the structure to bow in the opposite direction on the other side.

In some instances, the dual-sided structures are formed asymmetrically, meaning that different sequences of layers are formed on different sides of the substrate. This may be accomplished in certain instances by a sequence of processing steps, some of which take place in a processing chamber adapted to perform dual-sided deposition and others of which take place in a processing chamber adapted to perform single-sided deposition. The asymmetry in the sequence of layers on different sides of the substrate then results from the fact that material is deposited on only one side of the substrate during portions of the overall fabrication process. The use of different processing chambers may be facilitated in certain embodiments through the use of a cluster tool having robotic structures that easily effect transfers of substrates between the different chambers during fabrication. Use of such a cluster in fabrication of nitride structures is described in detail in copending, commonly assigned U.S. patent application Ser. No. 11/404,516, entitled "EPITAXIAL GROWTH OF COMPOUND NITRIDE SEMICONDUCTOR STRUCTURES," filed by Sandeep Nijhawan et al., the entire disclosure of which is incorporated herein by reference for all purposes.

The use of dual-sided deposition during at least a portion of the fabrication process may advantageously improve the overall throughput of the fabrication process. Conventional fabrication with multiple epitaxial deposition steps being performed in a single reactor in a single session results in a long processing time, usually on the order of 4-6 hours. This long processing time is manifested by low reactor throughput, which is often addressed by the use of batch processing techniques. For instance, commercial reactors used in production processes may operate simultaneously on 20-50 two-inch wafers, which results is relatively poor yield. The ability to deposit material on both sides of a substrate during a portion of the overall process may significantly enhance total productivity, even with the relatively long processing time.

2. Exemplary Substrate Processing System

Figure 4:
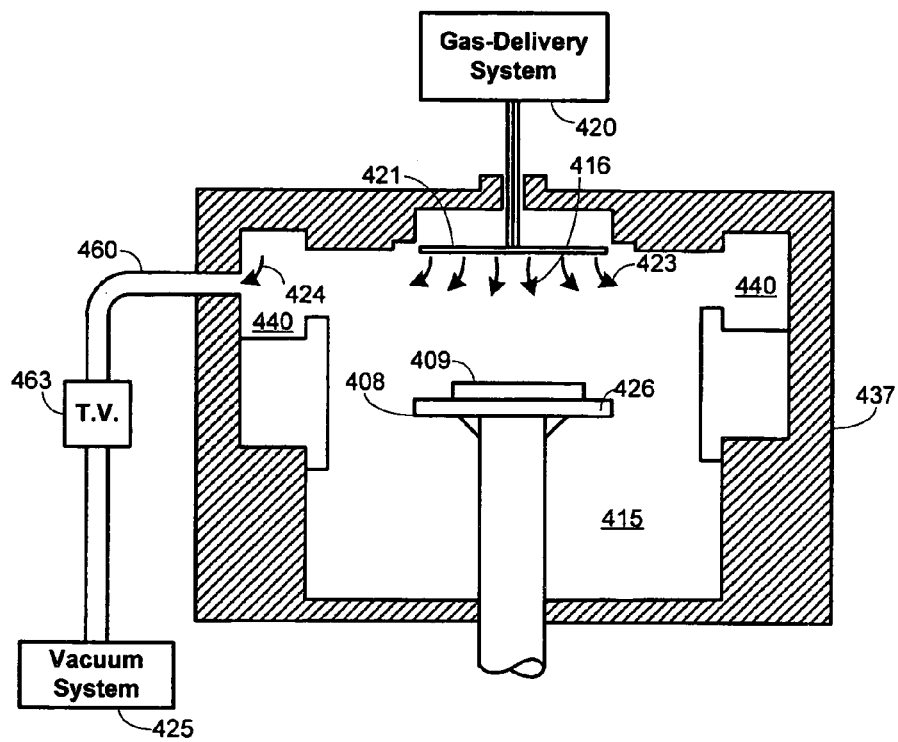
FIG. 4 is a simplified representation of an exemplary CVD apparatus that may be used in implementing certain embodiments of the invention.

FIG. 4 is a simplified diagram of an exemplary chemical vapor deposition ("CVD") system, illustrating the basic structure of a chamber in which individual deposition steps can be performed. This system is suitable for performing thermal, sub-atmospheric CVD ("SACVD") processes, as well as other processes, such as reflow, drive-in, cleaning, etching, deposition, and gettering processes. In some instances multiple-step processes can still be performed within an individual chamber before removal for transfer to another chamber. The major components of the system include, among others, a vacuum chamber 415 that receives process and other gases from a gas delivery system 420, a vacuum system 425, and a control system (not shown). These and other components are described in more detail below. While the drawing shows the structure of only a single chamber for purposes of illustration, it will be appreciated that multiple chambers with similar structures may be provided as part of a cluster tool, each tailored to perform different aspects of certain overall fabrication processes.

The CVD apparatus includes an enclosure assembly 437 that forms vacuum chamber 415 with a gas reaction area 416.

A gas distribution structure 421 disperses reactive gases and other gases, such as purge gases, toward one or more substrates 409 held in position by a substrate support structure 408. Between gas distribution structure 421 and the substrate 409 is gas reaction area 416. Heaters 426 can be controllably moved between different positions to accommodate different deposition processes as well as for an etch or cleaning process. A center board (not shown) includes sensors for providing information on the position of the substrate.

Different structures may be used for heaters 426. For instance, some embodiments of the invention advantageously use a pair of plates in close proximity and disposed on opposite sides of the substrate support structure 408 to provide separate heating sources for the opposite sides of one or more substrates 409. Merely by way of example, the plates may comprise graphite or SiC in certain specific embodiments. In another instance, the heaters 426 include an electrically resistive heating element (not shown) enclosed in a ceramic. The ceramic protects the heating element from potentially corrosive chamber environments and allows the heater to attain temperatures up to about 1200° C. In an exemplary embodiment, all surfaces of heaters 426 exposed to vacuum chamber 415 are made of a ceramic material, such as aluminum oxide ($Al_2O_3$ or alumina) or aluminum nitride. In another embodiment, the heaters 426 comprises lamp heaters. Alternatively, a bare metal filament heating element, constructed of a refractory metal such as tungsten, rhenium, iridium, thorium, or their alloys, may be used to heat the substrate. Such lamp heater arrangements are able to achieve temperatures greater than 1200° C., which may be useful for certain specific applications.

Reactive and carrier gases are supplied from gas delivery system 420 through supply lines to the gas distribution structure 421. In some instances, the supply lines may deliver gases into a gas mixing box to mix the gases before delivery to the gas distribution structure. In other instances, the supply lines may deliver gases to the gas distribution structure separately, such as in certain showerhead configurations described below. Gas delivery system 420 includes a variety of gas sources and appropriate supply lines to deliver a selected amount of each source to chamber 415 as would be understood by a person of skill in the art. Generally, supply lines for each of the gases include shut-off valves that can be used to automatically or manually shut-off the flow of the gas into its associated line, and mass flow controllers or other types of controllers that measure the flow of gas or liquid through the supply lines. Depending on the process run by the system, some of the sources may actually be liquid sources rather than gases. When liquid sources are used, gas delivery system includes a liquid injection system or other appropriate mechanism (e.g., a bubbler) to vaporize the liquid. Vapor from the liquids is then usually mixed with a carrier gas as would be understood by a person of skill in the art. During deposition processing, gas supplied to the gas distribution structure 421 is vented toward the substrate surface (as indicated by arrows 423), where it may be uniformly distributed radially across the substrate surface in a laminar flow.

The gas delivery system 420 may also be equipped to provide a corrosive gas stream to the processing chamber for use in certain processes. The corrosive gas stream may comprise a halogen precursor such as HCl or HF. Further details describing structures for providing such a corrosive gas stream are provided in copending, commonly assigned U.S. patent application Ser. No. 11/429,022, entitled "PARASITIC PARTICLE SUPPRESSION IN THE GROWTH OF III-V NITRIDE FILMS USING MOCVD AND HVPE," by David Bour et al., the entire disclosure of which is incorporated herein by reference for all purposes.

Purging gas may be delivered into the vacuum chamber 415 from gas distribution structure 421 and/or from inlet ports or tubes (not shown) through the bottom wall of enclosure assembly 437. Purge gas introduced from the bottom of chamber 415 flows upward from the inlet port past the heater 426 and to an annular pumping channel 440. Vacuum system 425 which includes a vacuum pump (not shown), exhausts the gas (as indicated by arrows 424) through an exhaust line 460. The rate at which exhaust gases and entrained particles are drawn from the annular pumping channel 440 through the exhaust line 460 is controlled by a throttle valve system 463.

The temperature of the walls of deposition chamber 415 and surrounding structures, such as the exhaust passageway, may be further controlled by circulating a heat-exchange liquid through channels (not shown) in the walls of the chamber. The heat-exchange liquid can be used to heat or cool the chamber walls depending on the desired effect. For example, hot liquid may help maintain an even thermal gradient during a thermal deposition process, whereas a cool liquid may be used to remove heat from the system during other processes, or to limit formation of deposition products on the walls of the chamber. Gas distribution manifold 421 also has heat exchanging passages (not shown). Typical heat-exchange fluids water-based ethylene glycol mixtures, oil-based thermal transfer fluids, or similar fluids. This heating, referred to as heating by the "heat exchanger", beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The system controller controls activities and operating parameters of the deposition system. The system controller may include a computer processor and a computer-readable memory coupled to the processor. The processor executes system control software, such as a computer program stored in memory. The processor operates according to system control software (program), which includes computer instructions that dictate the timing, mixture of gases, chamber pressure, chamber temperature, microwave power levels, pedestal position, and other parameters of a particular process. Control of these and other parameters is effected over control lines that communicatively couple the system controller to the heater, throttle valve, and the various valves and mass flow controllers associated with gas delivery system 420.

3. Asymmetric Double-Sided Structures

Figure 5A:
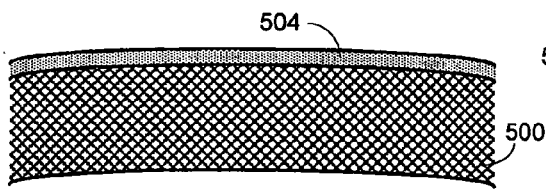
FIGS. 5A and 5B illustrate accommodating physical distortions of nitride-based structures with dual-sided deposition.
Figure 5B:
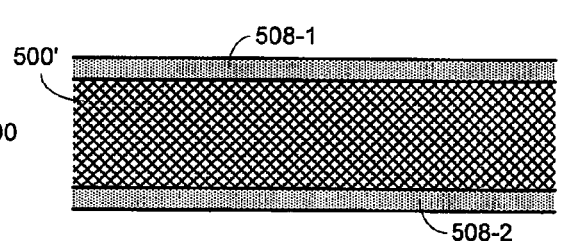
Figure 6:
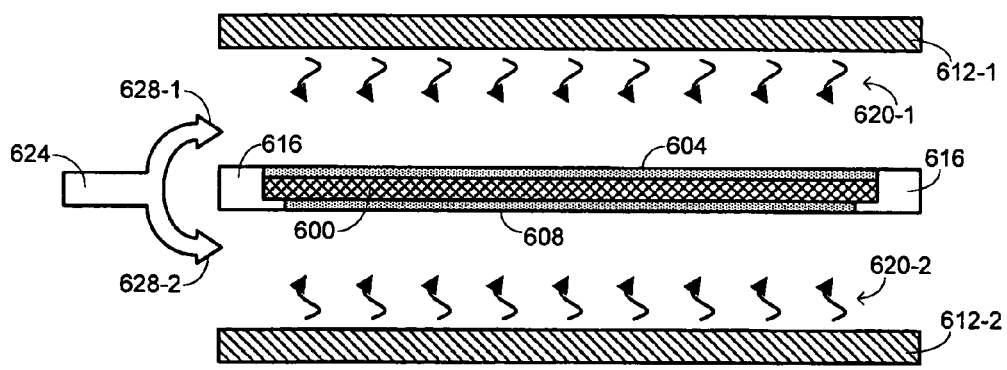
FIG. 6 provides an illustration of a structure that may be incorporated in the CVD apparatus of FIG. 4 to provide dual-sided deposition.

A general overview of how double-sided deposition may proceed is illustrated with FIGS. 5A-6, which show an example in which deposition is performed on both sides of a single substrate. The strain-balancing effect of depositing layers on both sides of a substrate is provided with FIGS. 5A and 5B. In FIG. 5A, the bowing described above results when a nitride layer 504 is deposited over a substrate 500 and then cooled. When deposition is performed on both sides, however, such as by depositing nitride layers 508 over substrate 500' in FIG. 5B, the bowing is significantly reduced.

As described in further detail below, asymmetric double-sided structures may be fabricated by processing a single substrate with both double-sided and single-sided deposition processes. The ability to balance the strain characteristics and thereby limit the deformation of the structure may depend on the specific characteristics of the layers that are deposited and the degree of asymmetry that they provide. For example, if relatively thick identical layers are deposited on both sides of a substrate with a separate thin layer being deposited on only one side of the substrate, the asymmetry is relatively small and still permits the strain to be substantially balanced.

FIG. 6 provides a detailed illustration of a substrate support structure that may be used to achieve double-sided deposition. In this drawing, the substrate 600 is supported by a substrate support structure 616 that permits access by precursor flows 628 to both sides of the substrate 600. The elements are arranged geometrically with respect to an input flow 624 of precursors so that the flow separates into flows 628 that pass along both sides of the substrate 600. The heater arrangement in this illustration comprises a pair of plates 612 disposed on opposite sides of the substrate support structure 616 to provide heat 620 to each side of the substrate 600. As previously noted, suitable materials for the plates 616 comprise graphite or SiC, among other materials. The combination of precursor flows 628 and 620 permit the growth of layers 604 and 608 on opposite sides of the substrate 600.

Figure 7:
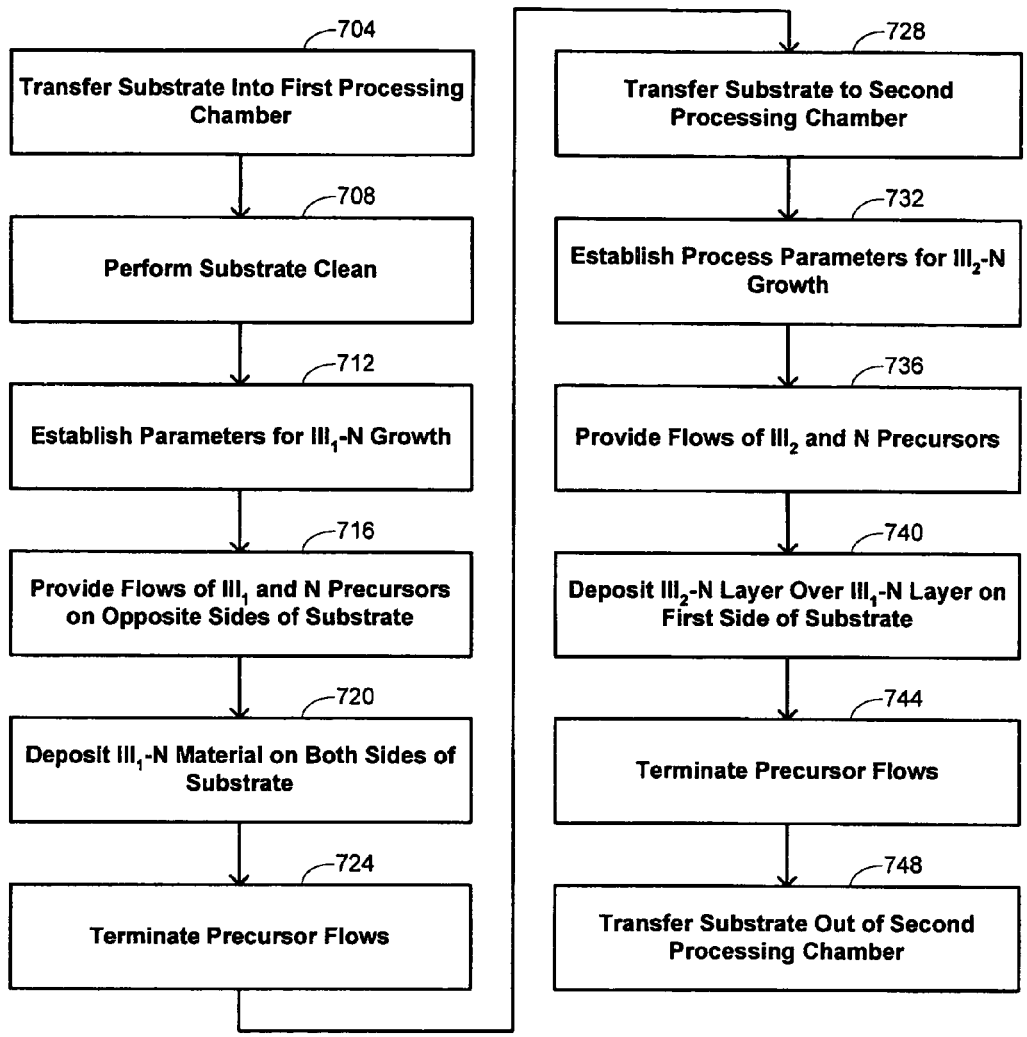
FIG. 7 is a flow diagram summarizing methods that may be used to achieve asymmetric dual-sided deposition in certain embodiments, with different structures formed on different sides of a substrate.

A method for fabrication of an asymmetric double-sided structure is illustrated with the flow diagram of FIG. 7. Use of such a method may result in the formation of a structure like that shown in FIG. 8. The following description accordingly makes reference to both drawings in describing the method. The method begins at block 704 by transferring a substrate 804 into a substrate processing chamber. For deposition of a nitride structure, the substrate may comprise sapphire, although other materials that may be used include SiC, Si, spinel, lithium gallate, aluminum gallate, ZnO, and others. One consequence of the strain balancing provided by the double-sided deposition is that the substrate may be thinner than is conventionally used for nitride deposition. In one embodiment, the thickness of the substrate is less than 150 μm, but may be less than 100 μm, less than 50 μm, less than 25 μm, or even less than 10 μm in other embodiments. It is generally expected that thinner substrates may be more readily used with materials having high strength, of which sapphire is one example. The reduced substrate thickness may advantageously reduce the overall cost of implementing the process, may improve heat dissipation, and may have other desirable effects.

Figure 8:
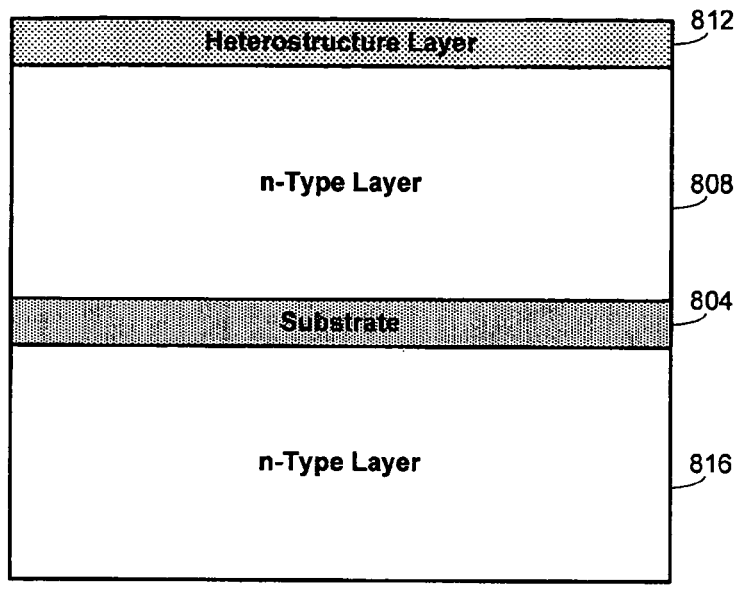
FIG. 8 provides a schematic illustration of a structure that has different structures formed on different sides of a substrate formed using a method of FIG. 7.

The substrate 804 is cleaned at block 708, after which process parameters suitable for growth of a nitride layer may be established at block 712. Such process parameters may include temperature, pressure, and the like to define an environment within the processing chamber appropriate for thermal deposition of a nitride layer. Flows of precursors are provided at block 716 on opposite sides of the substrate to deposit $III_1$-N layers 808 and 816 on both sides of the substrate at block 720. In the example of FIG. 8, both of these layers comprise n-type layers. The precursors generally include a nitrogen source and a source for a first group-III element such as Ga. For instance, suitable nitrogen precursors include $NH_3$ and suitable Ga precursors include trimethyl gallium ("TMG"). The first group-III element may sometimes comprise a plurality of distinct group-III elements such as Al and Ga, in which case a suitable Al precursor may be trimethyl aluminum ("TMA"); in another example, the plurality of distinct group-III elements includes In and Ga, in which case a suitable In precursor may be trimethyl indium ("TMI"). A flow of a carrier gas such as $N_2$ and/or $H_2$ may also be included.

After deposition of the $III_1$-N structure at block 720, the precursor flows are terminated at block 724. Fabrication of an asymmetric double-sided structure may be facilitated by transferring the substrate to a second processing chamber as indicated at block 728. The asymmetry is introduced in such an embodiment by performing a single-sided deposition of an overlying nitride layer in the second processing chamber. The deposition method is similar to that described for deposition of the double-sided layers 808 and 816. Process parameters suitable for deposition of different nitride layer are established at block 732 and flows of appropriate precursors are provided to the second processing chamber at block 736. A $III_2$-N layer is deposited over one of the $III_1$-N layers using a thermal deposition process at block 740. In the example of FIG. 8, this $III_2$-N layer corresponds to a heterostructure layer 812 deposited over the top n-type layer 808. After deposition of the $III_2$-N layer, the precursor flows may be terminated at block 744 and the substrate transferred out of the second processing chamber at block 748.

In some instances, the $III_2$-N structure includes a group-III element that is not comprised by the $III_1$-N layer, although the $III_1$-N and $III_2$-N layers may additionally comprise a common group-III element. For instance, in the case where the $III_1$-N layer is GaN, the $III_2$-N layer may be an AlGaN layer or an InGaN layer. While these are examples in which the $III_2$-N layer has a ternary composition, this is not required by the invention and the $III_2$ layer may more generally include such other compositions as quaternary AlInGaN layers. Similarly, in the case where the $III_1$-N layer is AlGaN, the $III_2$-N layer may be an InGaN layer on an AlInGaN layer. Suitable precursors for deposition of the $III_2$-N layer may be similar to the precursors used for the $III_1$ layer, i.e. $NH_3$ is a suitable nitrogen precursor, TMG is a suitable gallium precursor, TMA is a suitable aluminum precursor, and TMI is a suitable indium precursor. A carrier gas such as $N_2$ and/or $H_2$ may also be included.

The processing conditions used for deposition of the $III_1$-N and $III_2$-N layers may vary depending on specific applications. The following table provides exemplary processing conditions and precursor flow rates that are generally suitable in the growth of nitride semiconductor structures using the devices described above:

| Parameter | Value |
| --- | --- |
| Temperature (° C.) | 500-1500 |
| Pressure (torr) | 50-1000 |
| TMG flow (sccm) | 0-50 |
| TMA flow (sccm) | 0-50 |
| TMI flow (sccm) | 0-50 |
| $PH_3$ flow (sccm) | 0-1000 |
| $AsH_3$ flow (sccm) | 0-1000 |
| $NH_3$ flow (sccm) | 100-100,000 |
| $N_2$ flow (sccm) | 0-100,000 |
| $H_2$ flow (sccm) | 0-100,000 |

As will be evident from the preceding description, a process might not use flows of all the precursors in any given process. For example, growth of GaN might use flows of TMG, $NH_3$, and $N_2$ in one embodiment; growth of AlGaN might use flows of TMG, TMA, $NH_3$, and $H_2$ in another embodiment, with the relative flow rates of TMA and TMG selected to provide a desired relative Al:Ga stoichiometry of the deposited layer; and growth of InGaN might use flows of TMG, TMI, $NH_3$, $N_2$, and $H_2$ in still another embodiment, with relative flow rates of TMI and TMG selected to provide a desired relative In:Ga stoichiometry of the deposited layer.

The table also notes that group-V precursors different from nitrogen may also sometimes be included. For example, a III-N-P structure may be fabricated by including a flow of phosphine $PH_3$ or a III-N-As structure may be fabricated by including a flow of arsine $AsH_3$. The relative stoichiometry of the nitrogen to the other group-V element in the structure may be determined by suitable choices of relative flow rates of the respective precursors. In still other instances, doped compound nitride structures may be formed by including dopant precursors, particular examples of which include the use of rare-earth dopants.

A number of different optoelectronic structures may be fabricated using such methods and have the general structure shown in FIG. 8, although specific optoelectronic structures may have additional layers not shown in the drawing and will have specific chemical compositions. Examples of optoelectronic structures that may be fabricated in this way thus include LEDs, laser diodes ("LDs"), vertical-cavity surface-emitting lasers ("VCSELs"), vertically coupled horizontal-cavity surface-emitting lasers ("HCSELs"), and the like. Regardless of the specific structure of the optoelectronic devices, the n-type layers 808 are generally expected to be significantly thicker than the heterostructure, perhaps by about an order of magnitude or so. With such differences, the strain remains substantially balanced despite the asymmetry of the double-sided structure, resulting in a structure that is substantially undeformed. Because the shape deformities are largely or completely avoided, the optoelectronics devices have generally superior characteristics. For example, when an InGaN quantum-well active region is deposited over a GaN layer, the active region has improved alloy-composition uniformity that results from a more constant surface temperature across the substrate. The wavelength and power output of fabricated devices are thus also more uniform, improving the overall yield. Lithographic processing of the substrate into individual optoelectronic devices is simplified because the patterning is performed on a flatter surface, avoiding complications that result from implementing either contact or projection lithography on a curved surface.

While the method described in connection with FIG. 7 makes use of a plurality of processing chambers, it is possible to fabricate such asymmetric structures in other embodiments by performing the depositions in a single processing chamber. For example, an alternative structure like that in FIG. 8 could be fabricated to have a heterostructure layer overlying the bottom n-type layer 816 by using double-sided deposition processes for both the n-type layers and the heterostructure layers in a single chamber. This may be followed by an etching process to remove the extra heterostructure layer. The asymmetry that results from the absence of the extra heterostructure layer may avoid adverse effects on the performance of the optoelectronic device. This is because the extra heterostructure layer will generally be optically absorbing and its presence would reduce the optical efficiency of the device. This is true irrespective of whether the asymmetry is achieved as a result of performing a combination of double-sided and single-sided depositions or as a result of depositing and then removing an extra layer.

Figure 9:
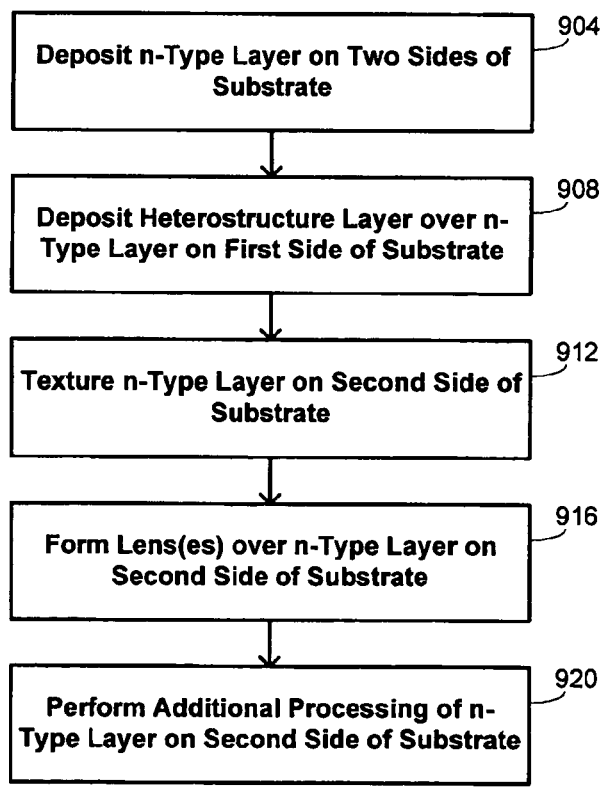
FIG. 9 is a flow diagram summarizing methods of forming optoelectronic devices with asymmetric dual-sided structures.

The asymmetry also enables certain additional processes to be performed in fabricating the optoelectronic devices more simply and/or more effectively. This is illustrated with FIG. 9, which is a flow diagram that begins with two-sided deposition of n-type layers at block 904 followed by single-sided deposition of a heterostructure layer over one of the n-type layers at block 908. The result of these steps is a structure like that described above in connection with FIG. 8. The additional processes that may be performed with the backside layer may improve the functionality of the optoelectronic device.

For example, block 912 indicates that the exposed n-type layer may be textured in some embodiments. Such texturing may be accomplished by exposing the layer to a corrosive agent such as a halogen precursor like HCl or HF, which causes the formation of pits in the surface of the layer. Processing conditions like the exposure time, flow rate, etc. may be optimized for such factors as the depth and separation of the pits and similar factors. Texturing of the surface permits an increase in the total light output of the device. This may be understood by considering the optical properties of the semiconductor layers comprised by nitride optoelectronic devices. The refractive index of such layers is high relative to air, with GaN having a refractive index of about 2.5 and other III-N layers having a refractive index of about 2-3. In accordance with Snell's law, the difference in refractive index with air results in an escape cone that defines the angles at which light from the device may escape to air. Light propagating in directions outside the escape cone is reflected back into the device where it is generally reabsorbed according to one or more of multiple reabsorption mechanisms. With the refractive indices of nitride semiconductors, the escape cone is relatively small so that only on the order of 5-10% of the light generated by the device is transmitted out of the device. The textured surface provides more angle locally that permit light to propagate in directions within the escape cone, and may increase the light output by as much as a factor of two. Because of their surface properties, texturing of the backside nitride is easier to accomplish and control than for the surface of the materials generally used as the substrate.

Block 916 indicates that one or more lenses may also be formed over the exposed n-type layer. Examples of structures that may be provided for such lenses include curved-surface and Fresnel lenses. The specific role played by lenses once formed may vary depending on the type of optoelectronic device. For example, when the optoelectronic device comprises an LED or a LD, the lens(es) may be used to improve the brightness of the device. When the optoelectronic device comprises a vertical-emitting laser such as a VCSEL or a vertically coupled HCSEL, the lens(es) may be used to collimate the light beam generated by the device.

There are a number of different ways in which lenses may be formed over the backside layer. One example makes use of photoresist or a similar type of masking material. The photoresist is deposited over the backside layer and formed into an approximately circular or elliptical shape. Exposure of the photoresist to a temperature cycle causes it to bead up and form a lens. Subsequent etching of the surface under etch conditions where the etch rate of the photoresist is approximately equal to the etch rate of the material underlying the photoresist causes the lens shape to be projected into the underlying material. The optical power of lenses formed in this way depends on the size of the initial region of photoresist, permitting some control over the optical power of lenses that are formed. It is generally easier to form lenses over nitride semiconductor materials than it is conventional substrate materials like sapphire, which is a very hard material.

As noted, the ability to provide texturing and to form lenses is simplified by the fact that the nitride semiconductor material on the backside of the substrate is generally easier to work with than the substrate material. While texturing and lens formation are examples of processes that the presence of the backside nitride layer thus enables, still other processes may be enabled by the relative ease of working with the nitride semiconductor material. Block 920 of FIG. 9 accordingly notes that additional processing may sometimes be performed on the backside nitride layer in addition to or instead of the texturing and lens formation described in detail.

Having fully described several embodiments of the present invention, many other equivalent or alternative methods of producing the cladding layers of the present invention will be apparent to those of skill in the art. These alternatives and equivalents are intended to be included within the scope of the invention, as defined by the following claims.

What is claimed is:

1. A method of fabricating a nitride optoelectronic device, the method comprising:
   simultaneously forming a first n-type III-N layer over a first side of a substrate and forming a second n-type III-N layer over a second side of the substrate opposite the first side, the first and second n-type III-N layers having substantially the same composition and comprising a first group-III element and nitrogen; and
   thereafter, forming a p-type III-N active layer over the first n-type III-N layer but not over the second n-type III-N layer, the p-type III-N active layer comprising a second group-III element and nitrogen, wherein the second group-III element is different from the first group-III element.

2. The method recited in claim 1 wherein simultaneously forming the first and second n-type III-N layers comprises:
   disposing the substrate within a first processing chamber;
   flowing a first group-III precursor and a first nitrogen precursor into the first processing chamber over the first and second sides of the substrate, wherein the first group-III precursor comprises the first group-III element; and
   depositing the first and second n-type III-N layers with a first thermal chemical-vapor-deposition process at a first elevated temperature within the first processing chamber using the first group-III precursor and the first nitrogen precursor.

3. The method recited in claim 2 wherein forming the p-type III-N active layer comprises:
   transferring the substrate from the first processing chamber to a second processing chamber different from the first processing chamber;
   flowing a second group-III precursor and a second nitrogen precursor into the first processing chamber over the first side of the substrate, wherein the second group-III precursor comprises the second group-III element; and
   depositing the p-type III-N active layer over the first n-type III-N layer with a second thermal chemical-vapor-deposition process at a second elevated temperature within the second processing chamber using the second group-III precursor and the second nitrogen precursor.

4. The method recited in claim 1 wherein:
   the first group-III element is gallium;
   the second group-III element is aluminum;
   the first n-type III-N layer comprises a GaN layer;
   the second n-type III-N layer comprises a GaN layer; and
   the p-type III-N active layer comprises an AlGaN layer.

5. The method recited in claim 1 wherein:
   the first group-III element is gallium;
   the second group-III element is indium;
   the first n-type III-N layer comprises a GaN layer;
   the second n-type III-N layer comprises a GaN layer; and
   the p-type III-N active layer comprises an InGaN layer.

6. The method recited in claim 1 wherein:
   the first group-III element is gallium;
   the second group-III element includes aluminum and indium;
   the first n-type III-N layer comprises a GaN layer;
   the second n-type III-N layer comprises a GaN layer; and
   the p-type III-N comprises an AlInGaN layer.

7. The method recited in claim 1 further comprising texturing the second n-type III-N layer.

8. The method recited in claim 7 wherein texturing the second n-type III-N layer comprises:
   disposing the substrate within a processing chamber; and
   flowing a corrosive stream within the processing chamber over the second n-type III-N layer.

9. The method recited in claim 8 wherein the corrosive stream comprises HCl.

10. The method recited in claim 1 further comprising forming a lens having optical power within the second n-type III-N layer.

11. The method recited in claim 1 wherein the substrate has a thickness less than 100 μm.

12. A method of fabricating a nitride optoelectronic device, the method comprising:
   disposing a sapphire substrate within a first processing chamber, the sapphire substrate having a first side and a second side and having a thickness less than 100 μm;
   flowing a first gallium precursor and a first nitrogen precursor into the first processing chamber over the first and second sides of the substrate;
   depositing a first n-type nitride layer over the first side of the substrate with a first thermal chemical-vapor-deposition process at a first elevated temperature within the first processing chamber using the first gallium precursor and the first nitrogen precursor, the first n-type nitride layer comprising gallium and nitrogen;
   depositing a second n-type nitride layer over the second side of the substrate with the first thermal chemical-vapor-deposition process at the first elevated temperature within the first processing chamber using the first gallium precursor and the first nitrogen precursor, the second n-type nitride layer comprising gallium and nitrogen;
   transferring the sapphire substrate from the first processing chamber to a second processing chamber after depositing the first and second n-type nitride layers;
   flowing a second gallium precursor, a group-III precursor, and a second nitrogen precursor into the second processing chamber over the first side of the substrate, the group-III precursor comprising a group-III element different from gallium; and
   depositing a p-type nitride layer over the first n-type nitride layer with a second chemical-vapor-deposition process at a second elevated temperature within the second processing chamber using the second gallium precursor, the group-III precursor, and the second nitrogen precursor, the p-type nitride layer comprising gallium, the group-III element, and nitrogen.

13. The method recited in claim 12 further comprising texturing the second n-type nitride layer.

14. The method recited in claim 12 further comprising forming a lens having optical power within the second n-type nitride layer.

* * * * *